United States Patent

Saiki et al.

[11] Patent Number: 5,859,407
[45] Date of Patent: Jan. 12, 1999

[54] CONNECTING BOARD FOR CONNECTION BETWEEN BASE PLATE AND MOUNTING BOARD

[75] Inventors: Hajime Saiki, Aichi; Kozo Yamasaki, Gifu, both of Japan

[73] Assignee: NGK Spark Plug Co., Ltd., Nagoya, Japan

[21] Appl. No.: 893,005

[22] Filed: Jul. 15, 1997

[30] Foreign Application Priority Data

Jul. 17, 1996 [JP] Japan .................................... 8-207743

[51] Int. Cl.$^6$ ............................................. H05B 1/00
[52] U.S. Cl. .................... 219/209; 219/543; 219/501; 338/307; 361/748; 439/76.1
[58] Field of Search .................... 219/209, 543, 219/501; 338/307, 309, 301, 312, 313; 174/52.1; 439/76.1; 361/748, 767

[56] References Cited

U.S. PATENT DOCUMENTS

| 4,481,403 | 11/1984 | Monte | 219/499 |
| 5,268,588 | 12/1993 | Youssef | 219/209 |
| 5,512,786 | 4/1996 | Imamura et al. | 23/48 |
| 5,736,780 | 4/1998 | Murayama | 361/748 |
| 5,744,759 | 4/1998 | Ameen | 174/260 |

FOREIGN PATENT DOCUMENTS

| 59-996 | 1/1984 | Japan . |
| 5-29390 | 2/1993 | Japan . |
| 6-291165 | 10/1994 | Japan . |
| 8-55930 | 2/1996 | Japan . |

*Primary Examiner*—Teresa J. Walberg
*Assistant Examiner*—Quan Nguyen
*Attorney, Agent, or Firm*—Foley & Lardner

[57] ABSTRACT

A connecting board to be interposed between a base plate and a mounting board for bonding or joining them together is provided. A connecting board has a heating wire disposed inside a substrate thereof, a plurality of soft metal bodies which are easily deformable, and a first solder layer and a second solder layer formed on a first surface side protruded portion and a second surface side protruded portion of each of the soft metal bodies. By energizing the heating wire and melting the first and second solder layers, the connecting board can be bonded on a first surface side of the substrate to the base plate and on a second surface side of the substrate to the mounting board all at once. By energizing the heating wire, the base plate and/or mounting board can be separated from the connecting board with ease.

17 Claims, 8 Drawing Sheets

CONNECTING BOARD FOR CONNECTION BETWEEN BASE PLATE AND MOUNTING BOARD

BACKGROUND OF THE INVENTION

1. Field of the Invention

The present invention relates to a connecting board disposed between a base plate having surface-bonding pads, such as a LGA type integrated circuit package base, and a mounting board such as a motherboard, to bond or connect the base plate to the mounting board. The present invention further relates to a method of making such a connecting board. The present invention further relates to an assembly of a base plate, connecting board and mounting board, and a subassembly of a base plate and connecting board. The present invention further relates to a method of making such an assembly and a method of making such a subassembly. The present invention further relates to a method of disassembling such an assembly.

2. Description of the Related Art

Recent development of the integrated circuit (IC) technology has brought about a continuous increase in the number of the input/output terminals provided to each IC chip. However, in case the input/output terminals are arranged at the peripheral portion of an IC chip, the size of the IC chip is increased with increase of the number of the input/output terminals, so it results undesirably that the cost of the IC chip and an IC chip package base is elevated and the yield rate of same is lowered.

Thus, it has been widely used a so-called flip chip technology, i.e., a technology by which a plurality of bumps are disposed on a main surface (planar surface) of an IC chip so as to form a grid pattern or checkered pattern, while a plurality of pads are disposed on a base plate at corresponding positions to the bumps of the IC chip and the both (i.e., bumps and pads) are soldered or joined together all at once. Further, in case of bonding a base plate having mounted thereon an IC chip or the like to a printed circuit board (PCB) such a motherboard, it is also carried out that a plurality of pads are disposed on the surface of the motherboard substrate to be matched with the base plate, a plurality of bumps having previously soldered thereto nearly spherical (ball-shaped) terminal members made of high temperature solder or Cu are provided to either of the base plate or the motherboard, and thereafter the both (i.e., the base plate and motherboard) are bonded together by soldering by way of the terminal members. In general, the base plate having only pads which are disposed so as to form a grid pattern is called a LGA (land grid array) base plate and a base plate having ball-shaped terminal members (connecting terminals) on pads is called a BGA (ball grid array) base plate.

In the meantime, in case pads and terminals are formed in the above manner on the surfaces of the IC chip, base plate and motherboard so as to form a linear pattern or grid pattern (including a checkered pattern) for bonding the IC chip and the base plate together and for bonding the base plate and the motherboard (hereinafter such bonding being referred to as "surface bonding") together, a difference in thermal expansion is caused between the IC chip and the base plate and between the base plate and the motherboard substrate along the mating planar surfaces thereof because they differ in material and therefore in coefficient of thermal expansion. In other words, the IC chip-mounted base plate and the motherboard substrate which are bonded together by way of the terminals are caused to deform in the same directions along the matching planar surfaces thereof but by a different amount from each other so that shearing stress is caused in the terminal members.

This shearing stress becomes maximum between the two terminals which are disposed remotest from each other when the magnitude of the shearing stress is taken into account between any two surface-bonded terminals. More specifically, in case the terminals are arranged so as to form a grid pattern and the outermost terminals form a square, the largest difference in thermal expansion occurs between the outermost terminals located at each pair of diagonal corners of the square, and the largest shearing stress is caused on each pair of the outermost terminals. Particularly, when a base plate such as a LGA type base plate or a BGA type base plate is bonded to a motherboard substrate, the interval (pitch) between the terminals is relatively large, so the distance between the most remotely separated terminals tends to become large. Further, when a LGA type or BGA type base plate is made of ceramic, the base plate has a smaller coefficient of thermal expansion than a motherboard substrate which is generally made of glass epoxy resin, so the resulting shearing stress is large.

When such shearing stress is applied to the joint between the base plate and the motherboard substrate, there may occur such a case in which a thermal stress is applied repeatedly to the masses of solder which are bonded to the pads of the base plate to cause a crack or cracks in some of the masses of solder at portions thereof adjacent the joint between the masses of solder and the pads, so it has been incapable of obtaining a high reliability.

In the meantime, by Japanese patent provisional publication No. 8-55930, it is disclosed a package for housing semiconductors, having pads disposed on the bottom of the depression formed in the lower surface of an insulation substrate and ball-shaped terminal members having a predetermined dimensional relation to the pads and soldered to the pads. It is also disclosed that by this arrangement the ball-shaped terminals can be brazed to the pads accurately and assuredly.

In the package of this prior art, however, depressions must be formed in the insulation substrate (base plate) and pads must be provided to the bottom of the depression, leading to a complicated shape, a difficulty in manufacture and an increase in cost.

Further, IC chip makers or manufacturers, after having purchased LGA type base plate on which IC chips are to be mounted, having mounted the IC chips on the base plate and having performed flip chip bonding, are required to bond the terminal members to the pads (lands) of the base plate by means of low temperature solder (for example, eutectic solder) which has a melting point lower than the solder (for example, high temperature solder) used for the flip chip bonding. In addition to the apparatus for flip chip bonding the IC chips to the base plate, there are required apparatuses for fabricating a BGA type base plate from a LGA type base plate, i.e., an apparatus for applying solder paste (for example, eutectic solder paste) to the pads and an apparatus for mounting the terminal members on the pads.

Further, by IC chip users (end users), it is carried out a difficult process for bonding the BGA type base plate to a printed circuit board, i.e., a process in which low temperature solder is applied to pads on a printed circuit board, a BGA type base plate is placed on the printed circuit board, the terminal members are aligned with the pads of the printed circuit board, and thereafter reflowing is carried out to bond by soldering the pads of the printed circuit board to the terminals.

Accordingly, the end users are required to apply low temperature solder to the pads of the printed circuit board, place the BGA type base plate on the printed circuit board, and put the printed circuit board and so on into a reflow furnace to bond the BGA type base plate to the printed circuit board.

Moreover, When it is found, after the BGA type base plate and the printed circuit board have been bonded in the above manner, that the mounted IC chip, the base plate or the printed circuit board is defective, the printed circuit board is removed from the BGA type base plate. This work is further difficult. This is because removal of the BGA type base plate from the printed circuit board to which the BGA type base plate have been connected by surface bonding requires to melt the low temperature solder by which the both (i.e., BGA type base plate and printed circuit board) are bonded. However, in consideration of the heat-resistant temperature or property of the printed circuit board, the heat-resistant temperature or property of the BGA type base plate and the IC chip, the heat-resistant temperature or property (melting point) of the solder in the flip-chip bonding of the pads of the IC chip and the BGA type or LGA type base plate, an allowable temperature range in heating is limited to be so narrow.

Furthermore, if it is tried to remove the BGA type base plate from the printed circuit board before some of the masses of solder (for example, several masses of solder) have not yet been melted, there may result such a case in which the pads of the BGA type base plate or the printed circuit board are damaged, and they finally become not reusable in not a few number of cases. Further, even if they are separated successfully, such separation cannot be always done in a way that all of the terminal members such as high temperature solder balls are in the same condition as they have assumed when they have been bonded to the LGA type base plate, i.e., when the BGA type base plate have been formed, so in case some terminal members remain on the printed circuit board side, it is further required to remove such terminals and bond them in place once again. Thus, it is difficult or it results in a poor reworking ability to separate the LGA type base plate (or BGA type base plate) and the printed circuit board having been bonded, from each other and to bond them once again.

Further, some of the printed circuit boards such as a motherboard or the like are adapted to mount thereon a plurality of BGA type base plates. When this is the case, the printed circuit board and a plurality of BGA type base plates are needed to be bonded (soldered) together at one time. If the printed circuit board having already bonded thereto one of the BGA type base plates is put into a reflow furnace for bonding thereto another BGA type base plate, even the solder between the printed circuit board and the BGA type base plate having already been bonded to the printed circuit board is caused to melt, so there is a possibility that the base plate having previously bonded to the printed circuit board is moved out of place.

In case of removing only particular one of BGA type base plates having mounted on a printed circuit board, it is necessary to consider the influence to the other base plates in addition to the above described difficulty and therefore a still more difficult work is necessitated.

SUMMARY OF THE PRESENT INVENTION

According to an aspect of the present invention, there is provided a connecting board to be interposed between a base plate having a plurality of surface-bonding pads and a mounting board having a plurality of surface-bonding and mounting pads at the corresponding positions to the surface-bonding pads of the base plate, for connection of the base pate and the mounting board. The connecting board comprises a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding and mounting pads of the mounting board, and a heating wire provided to the substrate for causing top portions of at least one of a group of the first terminals and a group of second terminals to melt when energized.

In this instance, the term "base plate" is herein used to indicate a wiring board or the like base plate on which an IC chip or the like electronic device is installed. The surface-bonding pad is a terminal formed on the base plate for electrical connection with the mounting board, i.e., pads for connection by means of surface bonding. The surface bonding is a bonding technology of using pads or bumps which are arranged on a chip, base plate or a motherboard so as to form a linear pattern or a grid pattern (including a checkered pattern) and bonding the base plate and the motherboard by way of the pads or bumps. A rectangular frame shape is an example of the linear pattern. A base plate having surface-bonding pads may be a LGA type base plate having pads (lands) arranged so as to form a grid pattern but may be a base plate having pads which are arranged so as to form another pattern.

The mounting board is a board for mounting thereon or attaching thereto the above described base plate, and a printed circuit board such as a motherboard is an example of the mounting board. Surface-bonding and mounting pads are formed on the mounting board for mounting the base plate on the mounting board by means of surface bonding.

The connecting board according to the present invention is disposed between the base plate and the mounting board and is bonded to them. The surface of the connecting board which is bonded to the base plate is called the "first surface" and the other surface which is bonded to the mounting board is called the "second surface" in order to be distinguished from each other for convenience.

Further, the material for the heating wire can be determined suitably on consideration of the heating temperature, the difference in thermal expansion from the connecting board substrate, the bonding strength (joining or connecting strength), the formability, etc. For example, when the connecting board substrate is made of alumina, the heating wire can be made of a metal containing tungsten and molybdenum as a major component or a metal containing nichrome as a major component.

Further, the heating wire can be arranged suitably depending upon the arrangement of the first and second terminals. For example, the heating wire may be arranged so as to form a single line, zigzag pattern, a ladder-like pattern or grid pattern.

With the this structure, by energizing the heating wire the top portions of the first terminals disposed on the first surface side of the substrate or the second terminals disposed on the second surface side are caused to melt. For example, for bonding the base plate to the connecting board, it will suffice to energize the heating wire and melt, for example, the top portions of the first terminals. That is, for such bonding, it is not necessary to place the base plate on the connecting board and put them in a reflow furnace as in the prior art, but it is only necessitated a power source for energizing the heating wire. Accordingly, it is not necessary to heat the entire of the connecting board substrate, so the IC chip mounted on the base plate is not subjected to heat and therefore there is not any possibility of the IC chip being deteriorated. Similarly, for bonding of the mounting board to the connecting board, it will suffice to energize the heating wire to melt the top portions of the second terminals. Accordingly, it is not necessary to heat the entire of the substrate, thus making it possible to carry out an attaching work for each base plate independently even in the case a plurality of base plates are to be attached to the substrate.

Further, contrary to the above, in case a subassembly consisting of a base plate and a connecting board having been already bonded or connected together (a connection board with a base plate) or an assembly consisting of a base plate, connecting board and mounting board is to be disassembled in such a way that the base plate and the connecting board are separated from each other, the both can be separated with ease by energizing the heating wire to melt the top portions of the first terminals. Similarly, in case the connecting board and the mounting board having been already bonded or connected to each other (a mounting board with a connecting board) or the assembly is to be disassembled in such a way that the connecting board and the mounting board are separated from each other, the both can be separated with ease by energizing the heating wire to melt the top portions of the second terminals. In either case, it is not necessitated to heat the base plate and the mounting board entirely to melt the solder at the bonded or joining portions as in the prior art, so damage of the pads at the time of disassembly never occurs.

That is, bonding the connecting board to the base plate or mounting board does not require a reflow furnace but can be attained only by energizing of the heating wire.

According to a further aspect of the present invention, the heating wire is disposed on a first surface side of the substrate to constitute a first surface side heating wire for causing the top portions of the first terminals to melt when energized or the heating wire is disposed on a second surface side of the substrate to constitute a second surface side heating wire for causing the top portions of the second terminal to melt when energized. Further, the connecting board may comprise both of the first and second heating wires.

By this, in case the first surface side heating wire is provided, bonding of the base plate to the connecting board can be attained only by energizing the first surface side heating wire to melt the top portions of the first terminals. On the contrary, in case the base plate and the connecting board having been already bonded to each other is to be separated, such separation can be attained only by energizing the first surface side heating wire to melt the top portions of the second terminals.

Similarly, in case the second surface side heating wire is provided, bonding of the connecting board to the mounting board can be attained by energizing the second surface side heating wire to melt the top portions of the second terminals. On the contrary, in case the connecting board and the mounting board having been already bonded to each other is to be separated, such separation can be attained only by energizing the second surface side heating wire to melt the second terminals.

Further, in case the first surface side heating wire, for example, is energized to melt the top portions of the first terminals, influence to the second terminals and further to the mounting board when the mounting board is connected to the second terminals, can be small. On the contrary, in case the second surface side heating wire is energized to melt the top portions of the second terminals, influence to the first terminals and further to the base plate when the base plate is connected to the first terminals, can be small.

According to a further aspect of the present invention, the heating wire is constructed and arranged so as to cause at least one of the groups of the first terminals and the group of the second terminals to be heated to a uniform temperature irrespective of positions thereof.

The heating wire generates heat when energized. In this connection, the heat is emitted generally more readily from the exterior portion of the substrate (i.e., the portion of the substrate remoter from the central portion of same or nearer to the outer periphery of same) than the interior portion of the substrate since the heat is easy to radiate at that portion. Thus, the temperature of the terminals located at the exterior portion of the substrate is liable to become lower than that of the terminals located at the interior portion of same.

When the terminals differ in temperature largely, there may occur such a case in which some of the terminals are melted and the other are not, resulting in that bonding of some terminals are insufficient and incomplete or some pads of the connecting board of itself or of the mating base plate or mounting board are damaged at the time of separation.

However, by constructing and arranging the heating wire so that the terminals are heated to a uniform temperature irrespective of positions thereof, all of the top portions of the terminals are caused to melt uniformly, so uniform bonding can be attained, and further easy and assured separation can be attained.

Such heating wire can be attained by the technology of making a portion of the heating wire have a different resistance (the resistance per unit length) from another portion suitably and thereby making the heat output from one portion of the heating wire differ from that from another portion, or the technology of arranging the heating wire in a way that arrangement of heating wire has a densely or finely arranged portion and a roughly arranged portion for thereby making the heat input to one unit area portion of the substrate differ from another portion area portion.

According to a further aspect of the present invention, the heating wire has an interior wire section which is located at an interior part of the substrate and an exterior wire section which is located at an exterior part of the substrate, the exterior wire section having a larger resistance per unit length than the interior wire section.

By this aspect, the heat output from the exterior heating wire becomes larger than that from the interior heating wire section, so the first and second terminals can be heated to a substantially uniform temperature irrespective of the positions thereof.

According to a further aspect of the present invention, the heating wire is disposed inside of the substrate.

By this aspect, even when the top portions of the first and second terminals are melted to spread over a wider area, the heating wire is never brought into contact with the terminals to cause a short circuit therebetween. That is, a connecting board which is highly reliable in bonding or connection can be obtained.

According to a further aspect of the present invention, the connecting board further comprises a first leader line terminal connected to one of opposite ends of the heating wire and a second leader line terminal connected to the other of the opposite ends of the heating wire, the first and second leader line terminals being disposed at peripheral corner portions of the substrate.

By this aspect, upon energizing of the heating wire, connection of the heating wire to an outside power source can be attained with ease.

In the meantime, in case a plurality of heating wires are provided, e.g., a first surface side heating wire and second surface side heating wire are provided, it is desirable to dispose such leader line terminals on the surface of the substrate to which the leader line terminals are located nearer.

According to a further aspect of the present invention, the substrate is made of ceramic.

In the meantime, the ceramic material can be, other than alumina, mullite, aluminum nitride, glass ceramic or the like and selection of the ceramic material is done suitably on consideration of easy manufacture, thermal conductivity and coefficient of thermal expansion.

By doing so, at the time of bonding of the base plate to the mounting board or their separation, the connecting board can be stable with respect to the heat applied thereto, and deformation such as bending, distortion or the like is hard to occur. Further, although the temperature of the heating wire and the substrate portion adjacent thereto becomes particularly high when the heating wire is energized, a trouble of the substrate due to heating, such as deconstruction, damage, carbonization or the like, never occurs.

According to a further aspect of the present invention, the substrate has a plurality of through holes extending between the first and second surfaces, a plurality of soft metal bodes being mounted in the through holes, respectively, each of the soft metal bodies having a first surface side protruded portion protruding from the first surface side of the substrate and a second surface side protruded portion protruding from the second surface of the substrate, a first solder layer being formed on the first surface side protruded portion and a second solder layer being formed on the second surface side protruded portion, the first and second solder layers having a lower melting point than the soft metal bodies, each of the first terminal being constituted by the first solder layer and the first surface side protruded portion of each of the soft metal bodies and each of the second terminal being constituted by the second solder layer and the second surface side protruded portion of each of the soft metal bodies.

In this connection, the soft metal bodies are made of soft metal, specific or concrete example of which is lead (Pb), tin (Sn), zinc (Zn), alloys containing some of these materials as major elements or components, and high temperature solders such as an alloy consisting of 95% Pb and 5% Sn or an alloy consisting of 90% Pb and 10% Sn. The soft metal bodies are deformed to absorb stresses produced between the base plate and the mounting board, between the base plate and connecting board substrate and/or between the connecting board substrate and the mounting board due to the difference in their coefficients of thermal expansion. For example, since recrystallization of lead and the like material occurs at ordinary temperatures, such materials can recrystallize after plastic deformation. Therefore, those materials are convenient since they are hard to break even if repeated stresses are applied thereto.

Further, although the first surface side solder layers and the second surface side solder layers are only required so as to be made of solder which is comparatively lower in melting point than the above described soft metal bodies, it is desirable to provide a suitable difference between their melting points of the solder layer and the soft metal body. For example, in case 90% Pb-10% Sn alloy (melting point is 301° C.) is used for the soft metal bodies, it will do to use 36% Pb-64% Sn eutectic solder (melting point is 183° C.) or the like alloy for the first surface side solder layers and the second surface side solder layers.

By this aspect, soft metal bodies extending through the connecting board substrate are deformed plastically to absorb the stresses produced between the base plate and the mounting board, between the base plate and connecting board substrate or between the connecting board substrate and the mounting board due to the difference in the coefficients of thermal expansion of the materials constituting the base plate, connecting board substrate and mounting board. Therefore, the soft metal bodies are not broken. Further, the surface-bonding pads on the base plate and the surface-bonding and mounting pads on the mounting board are not broken due to the stresses.

Further, since the soft metal bodies are provided with protruded portions on at least one of the first surface side and the second surface side of the substrate, the soft metal bodies can absorb, at the protruded portions, much stresses which are produced between the base plate or the mounting board and the connecting board. The protruded portions can deform without any restriction by the through holes of the connecting board, so they can deform much more for absorption of stresses.

Further, since each soft metal body has on the first surface side and the second surface side thereof the first solder layer and the second solder layer which are lower in the melting point than the soft metal bodies. Accordingly, by heating the connecting board up to the temperature at which the soft metal bodies do not melt but the solder layers are caused to melt, the connecting board can be bonded by solder to the base plate or to the mounting board.

Accordingly, simply by attaching the connecting board to the pads (lands) of a LGA type base plate and without the necessity of the process of applying solder paste to the pads or attaching ball-shaped terminals to the pads of the LGA type base plate as in the prior art, such terminals as those of the BGA type base plate can be given to the LGA type base plate with ease. That is, an equipment or apparatuses for printing of paste and installation of terminals can be dispensed with.

Further, for connection of the connecting board and the mounting board, it will suffice to melt the solder layers of the connecting board and connect them with the surface-bonding and mounting pads, so it can be dispensed with to apply paste onto the surface-bonding pads as in the prior art.

According to a further aspect of the present invention, there is provided a method of making a connecting board which comprises steps of preparing a first ceramic green sheet and a second ceramic green sheet which are respectively formed with a plurality of through holes at corresponding positions to each other, forming on an upper surface of the second ceramic green sheet a heating wire pattern of a heating conductor paste, and thereafter placing the first ceramic green sheet on the second ceramic green sheet in such a way that the heating wire pattern is disposed inside of the first and second green sheets, for thereby constituting a laminated green sheet assembly, applying metal paste to inner peripheral surfaces of the through holes and to surface portions of the laminated green sheet assembly next to the opposite ends of each of the through holes, firing the laminated assembly to form a connecting board substrate having a first surface and a second surface, and metal layers in the through holes, pouring, from either of a first surface side and a second surface side of the connecting board substrate, a mass of molten metal into each of the through holes and forming a soft metal body having a first surface side protruded portion and a second surface side protruded portion protruding from the first and second surfaces of the connecting board substrate, respectively, and forming a first solder layer and a second solder layer having a lower melting point than the soft metal bodies, on the first surface side protruded portion and the second surface side protruded portion of each of the soft metal bodies.

In this instance, as a technology of forming the first and second solder layers, it can be employed a technology of applying solder paste having a melting point lower than that of the soft metal bodies, to the soft metal bodies and heating the paste, or dipping the soft metal bodies into the molten solder bath.

By doing so, the heating wire can be formed simultaneously with the ceramic connecting board substrate, so the heating wire can be manufactured at low cost.

In the meantime, after the first and second green sheets are placed one upon the other to constitute a laminated assembly, the through holes can be formed in the laminated assembly.

According to a further aspect of the present invention, there is provided a subassembly of a connecting board and a base plate, wherein the base plate has a plurality of surface-bonding pads, and the connecting board includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding pads of the mounting board, and a heating wire provided to the substrate for causing top portions of the second terminals to melt when energized, and wherein the first terminals of the connecting board are bonded to the surface-bonding pads of the base plate, respectively.

By this aspect, in case the base plate with the connecting board is to be further bonded to a printed circuit board or the like mounting board, the heating wire is energized to melt the top portions of the second terminals on the second surface side of the substrate, whereby the base plate with the connecting board and the mounting board can be bonded to each other, without the necessity of heating the base plate with the connecting board and the mounting board from the outside thereof. Further, such bonding can be attained without the necessity of applying solder past to the surface-bonding pads of the mounting board. Further, in case the mounting board and the base plate with the connecting board are to be disassembled (separated from each other), the heating wire is energized to melt the top portions of the second terminals by way of which the both are bonded together, whereby the both can be separated with ease.

Further, since the connecting board is interposed between the base plate and the mounting board, it can absorb the stresses resulting from the difference in coefficient of thermal expansion between the base plate and the mounting board and makes it possible to attain highly durable bonding or connection.

According to a further aspect of the present invention, there is provided a subassembly of a connecting board and a base plate, wherein the base plate has a plurality of surface-bonding pads, and the connecting board includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding pads of the mounting board, and a heating wire provided to the substrate for causing top portions of the first terminals to melt when energized, and wherein the first terminals of the connecting board are bonded to the surface-bonding pads of the base plate, respectively.

By this aspect, in case the connecting board is to be disassembled (separated) from the base plate with the connecting board, the heating wire is energized to melt the top portions of the first terminals by way of which the both are bonded together, whereby the both can be separated with ease.

According to a further aspect of the present invention, there is provided an assembly of a base plate, a connecting board and a mounting board, wherein the base plate has a plurality of surface-bonding pads, the mounting board has a plurality of surface-bonding and mounting pads, and the connecting board includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding pads of the mounting board, and a heating wire provided to the substrate for causing top portions of at least one of a group of the first terminals and a group of second terminals when energized, and wherein the connecting board is interposed between the base plate and the mounting board, the surface bonding pads of the base plate are bonded to the first terminals of the connecting board on a first surface side of the substrate, respectively, and the surface bonding and mounting pads of the mounting board are bonded to the second terminals of the connecting board on a second surface side of the substrate, respectively.

By this aspect, in case the base plate or the mounting board is to be disassembled (separated) from the assembly, i.e., the assembly is to be separated into the base plate and the mounting board with the connecting board or into the base plate with the connecting board and the mounting board, the heating wire is energized to melt the top portions of the first terminals or the second terminals, whereby such disassembly or separation can be attained with ease.

According to a further aspect of the present invention, there is provided a method of making an assembly of a base plate, a connecting board and a mounting board. The method comprises steps of preparing the base plate having a plurality of surface-bonding pads, preparing the mounting board having a plurality of surface-bonding and mounting pads at the corresponding portions to the surface-bonding pads of the base plate, preparing the connecting board which includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding pads of the mounting board, and a heating wire provided to the substrate for causing top portions of the first and second terminals to melt, when energized, preparing the base plate having a plurality of surface-bonding pads, interposing the connecting board between the base plate and the mounting board, energizing the heating wire to melt the top portions of the first and second terminals, and thereby bonding the first terminals on the first surface side of the substrate to the surface-bonding pads of the base plate for thereby bonding the connecting board to the base plate, and bonding the second terminals on the second surface side of the substrate to the surface-bonding and mounting pads of the mounting board for thereby bonding the connecting board to the mounting board.

By this aspect, only by interposing the connecting board between the base plate and the mounting board and energizing the heating wire, the three devices can be bonded together at one time to constitute the assembly. Accordingly, in case, for example, a LGA type base plate (i.e., base plate) is to be bonded to a printed circuit board (i.e., mounting board), bonding between the base plate and the connecting board and between the connecting board and the mounting board can be attained only by energizing the heating wire after the connecting board has been prepared. That is, the process of attaching the terminals such as solder balls to the base plate and the process of applying solder paste to the surface-bonding pads of the mounting board can be dispensed with, thus making it possible to produce the assembly at low cost. Further, it is not necessary for the IC chip makers to have the equipment for forming the BGA type base plate from the LGA type base plate, and it becomes possible for the end users to dispense with the equipment for and the process of applying solder paste to the printed circuit board. Further, the base plate and the mounting board can be bonded together by subjecting the IC chip to heating a reduced number of times, i.e., not two times as in the prior art but only one time, so deterioration of the IC chip due to heating is hard to occur.

Further, in case the base plate or the mounting board is to be separated from the assembly, the heating wire is energized to melt the top portions of the first and second terminals, whereby such separation can be attained with ease.

According to a further aspect of the present invention, there is provided a method of making an assembly of a base plate, connecting board and a mounting board. The method comprises steps of preparing the base plate having a plurality of surface-bonding pads, preparing the mounting board having a plurality of surface-bonding and mounting pads at corresponding positions to the surface-bonding pads of the base plarte, preparing the connecting board which includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding and mounting pads of the mounting board, and a heating wire provided to the substrate for causing top portions of the first and second terminals to melt when energized, preparing a subassembly of the base plate and the connecting board by placing the connecting board and the base plate one upon the other, energizing the heating wire of the connecting board to melt the top portions of the first terminals and bonding the first terminals of the connecting board to the surface-bonding pads of the base plate, respectively, placing the subassembly of the base plate and the connecting board on the mounting board, and energizing the heating wire to melt the top portions of the second terminals on the second surface side of the substrate and bonding the surface-bonding and mounting pads of the mounting board to the second terminals.

By this aspect, the process of applying solder paste to the surface-bonding and mounting pads of the mounting board can be dispensed with, so the assembly of the base plate, connecting board and the mounting board can be manufactured at low cost.

According to a further aspect of the present invention, there is provided a method of disassembling the assembly of the base plate, connecting board and mounting board. The base plate has a plurality of surface-bonding pads, and the mounting board has a plurality of surface-bonding and mounting pads at corresponding positions to the surface-bonding pads of the base plate. The connecting board includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding pads of the mounting board, and a heating wire provided to the substrate for causing top portions of at least one of a group of the first terminals and a group of the second terminals to melt when energized. The connecting board is interposed between the base plate and the mounting board and bonded on the first surface side of the substrate to the base plate through bonding of the first terminals thereof to the surface-bonding pads of the base plate and on the second surface side of the substrate to the mounting board through bonding of the second terminals thereof to the surface-bonding and mounting pads of the mounting board. The method comprises steps of energizing the heating wire and melting top portions of at least one of the group of the first terminals and the group of the second terminals, and separating at least one of the base plate and the mounting board from the connecting board.

By this aspect, the base plate or the mounting board can be separated from the connecting board easily and assuredly, and the base plate and the mounting board can be made reusable with ease. Further, in case a plurality of base plates are connected to the mounting board, the base plates can be disassembled separately or independently and there is no necessity of heating the base plates entirely.

The above structures and methods can solve the above noted problems inherent in the prior art.

It is accordingly an object of the present invention to provide a novel and improved connecting board which makes it possible to bond or connect a LGA type base plate or the like base plate having surface-bonding pads and a printed circuit board or the like mounting board having surface-bonding pads, with ease and furthermore in a way as to enable such bonding to be highly durable and reliable.

It is a further object of the present invention to provide a connecting board of the foregoing character which can be reworked with ease.

It is a further object of the present invention to provide a subassembly of a base plate and a connecting board of the foregoing character, which can be connected with ease, separated with ease and connected once again with ease.

It is a further object of the present invention to provide an assembly of a base plate, connecting board of the foregoing character and mounting board, which can be reworked with ease.

It is a further object of the present invention to provide a method of making a connecting board of the foregoing character.

It is a further object of the present invention to provide a method of making a subassembly of a base plate and a connecting board of the foregoing character.

It is a further object of the present invention to provide a method of making an assembly of a base plate, a connecting board of the foregoing character and a mounting board.

BRIEF DESCRIPTION OF THE DRAWINGS

FIGS. 1A to 1B are illustrations of process steps for forming an assembly of laminated green sheets for a connecting board substrate, wherein FIG. 1A is a perspective view of a single green sheet and FIG. 1B is a perspective view of an assembly of laminated green sheets;

FIGS. 2A to 2C are illustrations of further process steps for forming the connecting board substrate, wherein FIG. 2A is an enlarged, fragmentary sectional view of the connecting board substrate before firing, FIG. 2B is a view similar to FIG. 2A but shows the connecting board substrate after firing, and FIG. 2C is a view similar to FIG. 2A but shows the connecting board substrate after plated;

FIGS. 3A and 3B are illustrations of process steps for mounting a soft metal body on the connecting board substrate of FIG. 2C, wherein FIG. 3A is an enlarged, fragmentary sectional view of the substrate with a soft metal body, in a state before mounting of the soft metal body on the substrate, and FIG. 3B is a view similar to FIG. 3A but shows the substrate and the soft metal body in a state after mounting of the soft metal body on the substrate;

FIGS. 5A and 5B are illustrations of process steps for forming solder layers on protruded portions of the soft metal body located on opposite sides (i.e., first and second surfaace sides) of the connecting board substrate, wherein FIG. 5A is a view similar to FIG. 4 but shows the assembly of the connecting board substrate and the soft metal bodies together with transfer plates, and FIG. 5B is a view similar to FIG. 4 but shows the assembly of the connecting board substrate and the soft metal bodies in a state after reflowing;

FIGS. 8A and 8B are illustrations of process steps for connecting the connecting board to the base plate of FIG. 7A and the printed circuit board of FIG. 7B, wherein FIG. 8A is a sectional view of the connecting board and the printed circuit board which are placed one upon the other, and FIG. 8B is a view similar to FIG. 8A but shows the base plate which is further placed upon the laminated subassembly of FIG. 8A;

DETAILED DESCRIPTION OF THE PREFERRED EMBODIMENTS

Referring first to FIGS. 1A to 6, a connecting board and a method of making the same according to the present invention will be described.

Firstly, by a known green sheet forming technology, two green sheets G1 and G2 made of alumina in a way as to have through holes H1 and H2 which are arranged so as to form a grid pattern and at corresponding positions, respectively.

Figure 1A:
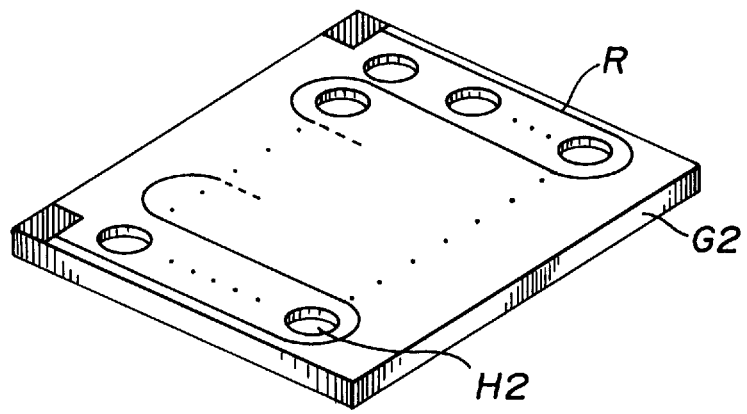

Of those green sheets, there is formed on the upper surface of the sheet G2 a predetermined pattern R of tungsten paste for forming a heating wire as shown in FIG. 1A. In this embodiment, the pattern R is in the form of a single continuous line extending in a zigzag manner along and between the rows of the through holes H2 (the rows extending nearly horizontally in FIG. 1A).

Figure 1B:
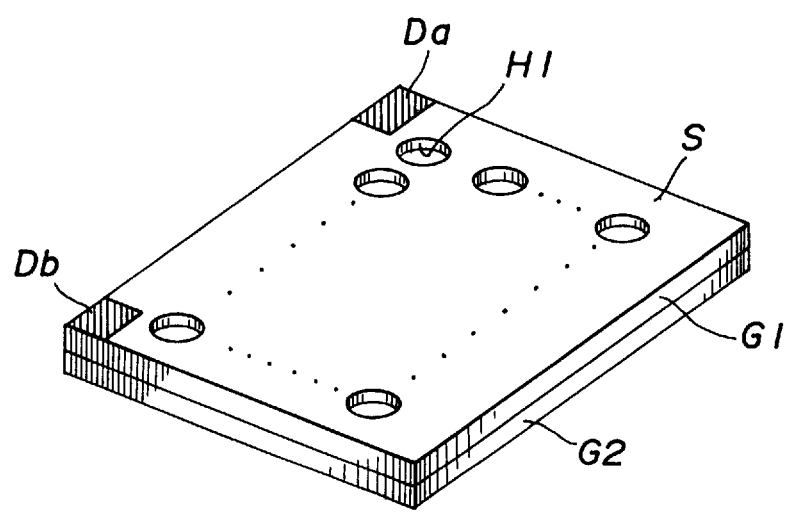

Then, as shown in FIG. 1B, the sheet G1 is placed on the upper surface of the sheet G2 in a way that the pattern R is disposed inside of the sheets, and they are pressed to adhere to each other and constitute a laminated green sheet assembly S having through holes H which are arranged so as to form a grin pattern. In the meantime, at two adjacent corner areas on the upper surface of the laminated green sheet assembly S there are formed terminals Da and Db connected to the opposite ends of the pattern R, respectively.

Figure 2A:
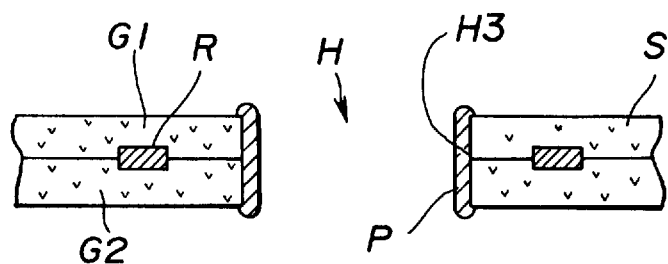

Further, as shown in FIG. 2A, tungsten paste P is applied to the inner peripheral surface H3 of each through hole H.

Figure 2B:
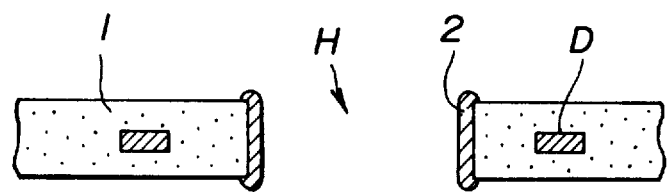

Then, the laminated green sheet assembly S is sintered in a reducing atmosphere and at the maximum temperature of 1550° C., whereby a ceramic connecting board substrate 1 having such a cross section shown in FIG. 2B is formed. The substrate 1 has inside thereof a heater circuit or heating wire D and on the inner peripheral surface of each through hole H a base metal layer 2 containing tungsten as a major component. Further, though not shown, at two corner areas on the upper surface of the substrate 1 there are formed leader line terminals Da and Db (refer to FIG. 1B) of the heating wire D.

In this instance, after firing, the connecting board 1 has a nearly square shape, i.e., 0.3 mm thick and 25 mm square. The through holes H are 0.8 mm in diameter and arranged at a pitch of 1.27 mm so as to form a grid pattern consisting of 19 vertical rows and 19 horizontal rows, i.e., three hundred and sixty-one through holes H in total are provided. Further, the thickness of the base metal layer 2 is about 20 $\mu$m. The heating wire D is disposed inside the substrate 1 and arranged in a zigzag manner so as to extend along and between the rows of through holes H.

Figure 2C:
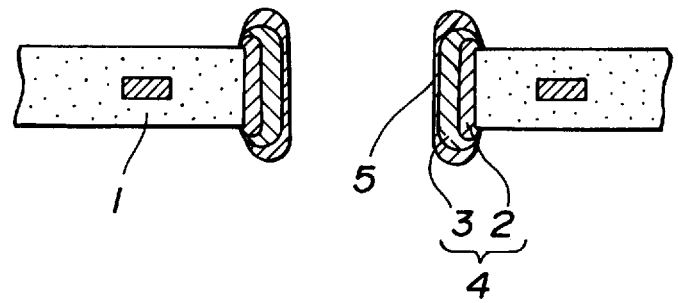

Further, on the base metal layer 2, there is formed, as shown in FIG. 2C, an electroless Ni—B plated layer 3 of about 4 $\mu$m in thickness, so that both layers 2 and 3 constitute a metal layer 4 to which soft metal is welded as will be described later. In order to prevent oxidation of the Ni—B plated layer 3, an electroless gold-plated layer 5 is formed thereon.

Figure 3A:
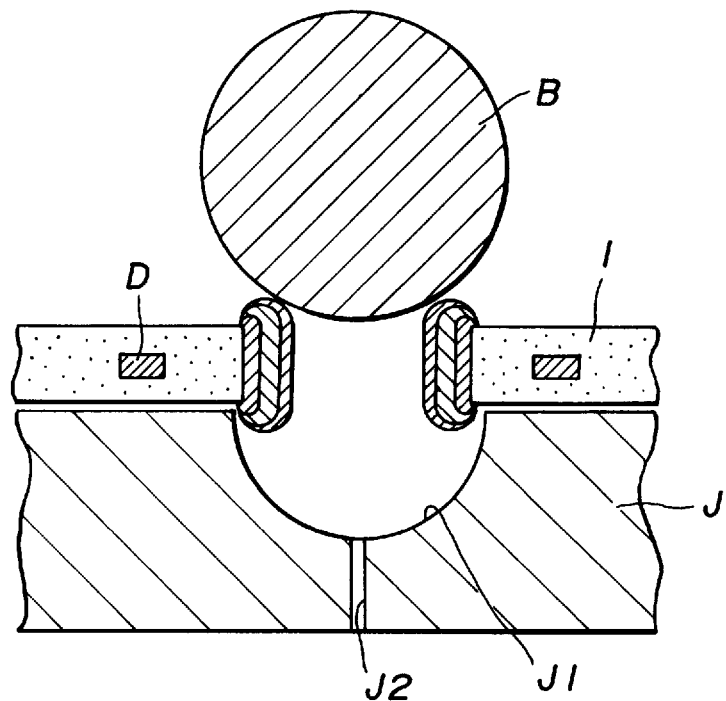

Then, as shown in FIG. 3A, a carbon jig J having semi-spherical depressions J1 of 0.5 mm in radius in the upper surface thereof and at corresponding positions to the through holes H, is prepared, and the connecting board substrate 1 is placed on the jig J in a way that the through holes H are aligned with the depressions J1. The carbon jig J has a property of being unwettable to molten metal such as high temperature solder as will be described later. In the meantime, the carbon jig J is formed with air vents J2 having a small diameter (0.2 mm), each of which extends through the receiving jig J from the bottom of each depression J1 to the lower surface of the receiving jig J. Further, a high temperature solder ball B of 90% Pb-10% Sn and having a diameter of 0.9 mm is placed on the upper end of each through hole H.

Figure 3B:
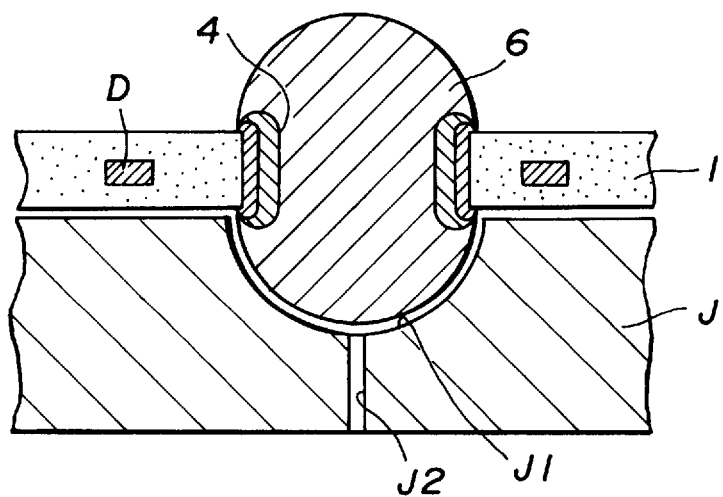

Then, the connecting board substrate 1, the carbon jig J and the high temperature solder balls B which are placed one upon another in the above manner are put in a reflow furnace of the maximum temperature of 360° C. and of the maximum temperature holding time of one minute in a nitrogen atmosphere, whereby to melt the high temperature solder balls B. As shown in FIG. 3B, the molten high temperature solder balls B are caused to come down under the gravity and poured or injected into the through holes H and welded onto the metal layer 4 (the Ni—B plated layer 3). The portion of molten high temperature solder on the lower surface side of the connecting board substrate 1 (i.e., the lower portion of molten high temperature solder) is swollen into a semi-spherical shape after the shape of the depressions J1 of the receiving Jig J, and the portion of the molten high temperature solder on the upper surface side of the connecting board substrate 1 (i.e., the upper portion of molten high temperature solder) is swollen upward to such an extent corresponding to an amount by which the volume of the molten high temperature solder is larger than the volume of each through hole H. The upward bulged or swollen portion of the molten metal solder becomes nearly semi-spherical or spherical due to the surface tension of the molten solder. In this example, the shape of the swollen molten metal solder was nearly semi-spherical.

In the meantime, the gold-plated layer 5 is diffused into the molten high temperature solder to disappear, so the high temperature solder is directly welded onto the Ni—B plated layer 3, whereby the soft metal body 6 made of high temperature solder is fixed or adhered to the connecting board substrate 1. The air vents J2 in the jig J relieve the air in the depressions J1. Since the jig J is not wettable to the solder and the air vents J2 are small in size, the solder does not enter the air vents J2. In the above manner, the soft metal bodies 6 made of high temperature solder were formed in the through holes H.

Figure 4:
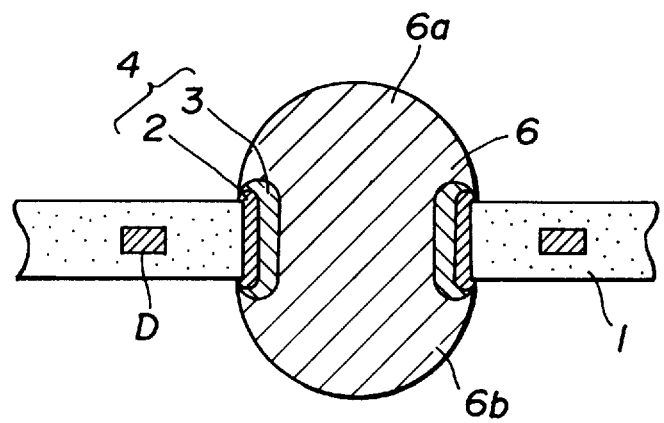
FIG. 4 is an enlarged, fragmentary sectional view of an assembly of a connecting board substrate and soft metal bodies.

As shown in FIG. 4, each soft metal body 6 is inserted or mounted in the corresponding through hole H of the connecting board substrate 1 and fixedly attached to the substrate 1 through the metal layer 4. The portion of the soft metal body 6 which is on the lower surface side of the connecting board substrate 1 forms a substantially semi-spherical protruded portion (swollen portion) 6b which has a complementary shape to the shape of the depression J1 of the receiving jig J and has a height of 0.3 mm above the surface of the substrate 1 and a radius of 0.43 mm, and the portion of the soft metal body 6 which is on the upper surface side forms a substantially semi-spherical protruded portion (swollen portion) 6a which is formed due to the surface tension and has a height of 0.3 mm above the surface of the substrate 1 and a radius of 0.43 mm. The protruding heights of the protruded portions 6a as well as the protruding heights of the protruded portions 6b were of an uniform or fixed value since the high temperature solder balls B having the same volume were used.

Then, two carbon sheet jigs (i.e., transfer plate formed from a carbon sheet) L having through holes at corresponding positions to the through holes H of the connecting board substrate 1 are prepared, and the through holes L1 are filled up with low melting point solder paste (eutectic solder) by squeezing. By this, the amount of paste 7 filling the through hole L1 can be regulated to a predetermined value with ease. One of the transfer plates L, the connecting board substrate 1 and the other of the transfer plates L are disposed and set in this order on a carbon support jig M in such a manner that the through holes L1 of each transfer plate L are aligned with the soft metal bodies 6 or the through holes H (refer to FIG. 5A).

Figure 5A:
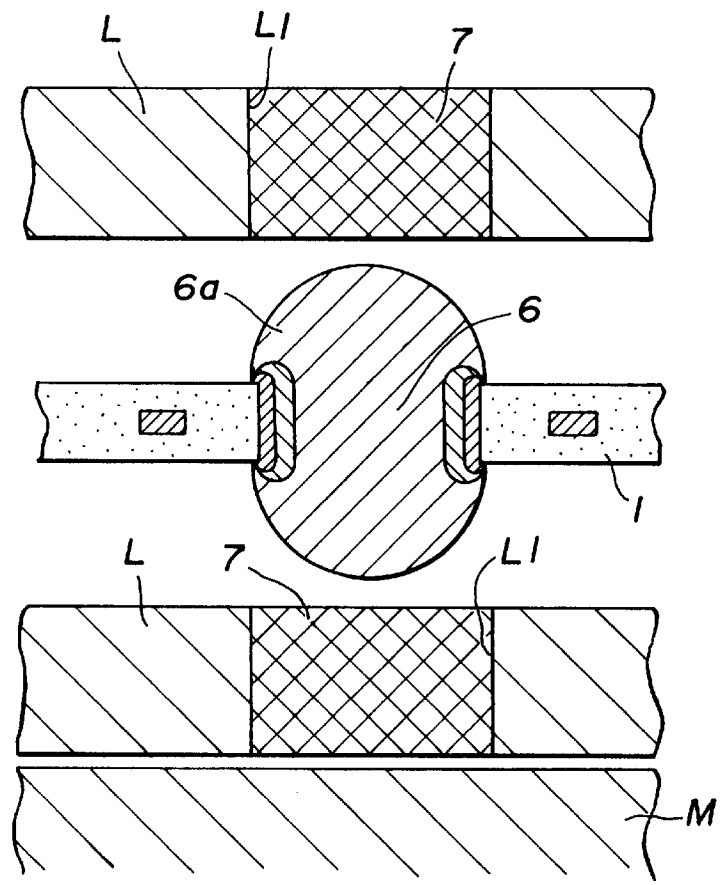
Figure 5B:
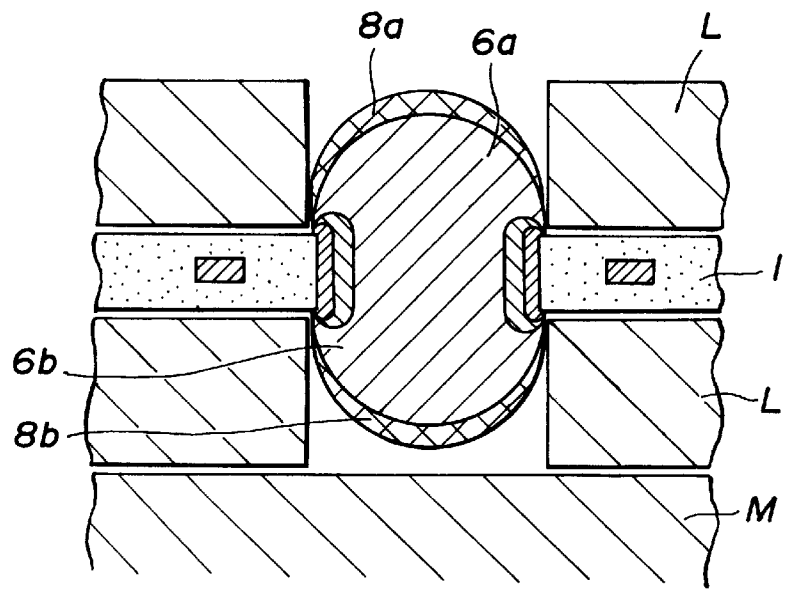

Thereafter, the set of the transfer plates L, the connecting board substrate 1 and the support jig M is put into a reflow furnace of the maximum temperature of 220° C. and the maximum temperature holding time (i.e., the time for which a work is held at the maximum temperature within the furnace) of one minute to make the low melting point solder paste 7 to melt in a nitrogen atmosphere. In the meantime, under such a temperature condition, the soft metal body 6 is not caused to melt. As shown in FIG. 5B, the melted masses of low melting point solder wet the upper and lower protruded portions 6a and 6b of the soft metal body 6 and extend thereover, and are formed into solder layers 8a and 8b, respectively. Since the amount of the paste 7 is regulated to a predetermined constant amount, the solder layers 8a and 8b are constant or uniform in the amount (i.e., volume), and therefore are equal in height at each protruded portions.

In the meantime, by making suitably smaller the thickness of the carbon jig (transfer plate) L in place of making smaller the thickness of the carbon jig (transfer plate) L, it becomes possible to prevent the solder layers 8a and 8b from being expanded sideways and becoming lower in height for the reason of the fact that the transfer plate L is not wetted by solder, thus making it possible to increase the height of the solder layer which is formed by the same amount of solder.

Figure 6:
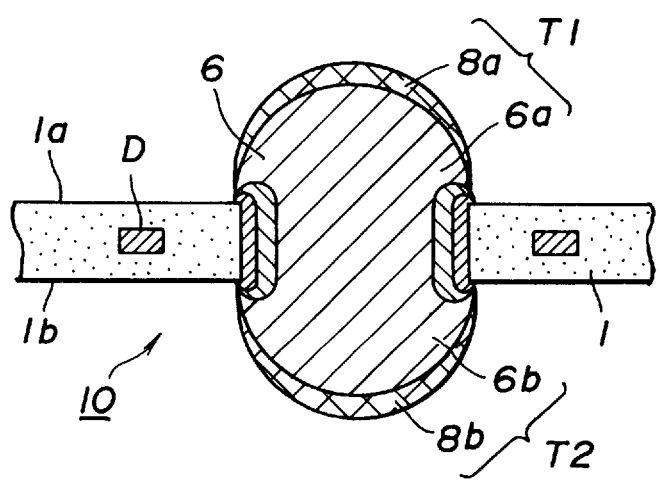
FIG. 6 is an enlarged, fragmentary sectional view of a connecting board in a finished or completed state, according to an embodiment of the present invention.

In this manner, a connecting board 10 shown in FIG. 6 is completed.

The connecting board 10 has the heating wire D disposed inside the connecting board substrate 1, second terminals T2 each of which is nearly semispherical and 0.35 mm in height from the surface of the substrate 1, disposed on the lower surface (second surface) 1b side and consists of the protruded portion 6b of the soft metal body 6 and the solder layer 8b formed on the protruded portion 6b, and first terminals T1 each of which is nearly semispherical and 0.35 mm in height from the surface of the substrate 1, disposed on the upper surface (first surface) 1a side and consists of the protruded portion 6a and the solder layer 8a formed on the protruded portion 6a.

Then, the connecting board 10 completed in the above described manner is connected to a base plate and a mounting board in the following manner.

Figure 7A:
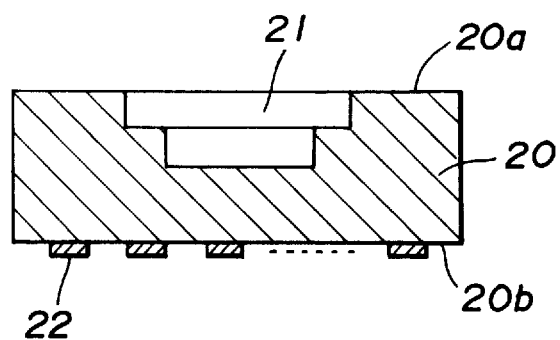
FIG. 7A is a sectional view of a base plate to be bonded or connected to a connecting board.

Firstly, a LGA (land grid array) type board 20 of 1.0 mm thick and 25 mm nearly square as shown in FIG. 7A is prepared as a base plate to which the connecting board 10 is to be bonded or connected. The LGA type board 20 is a circuit board made of alumina ceramic and has on the upper surface 20a side a cavity 21 in which an IC (integrated circuit) chip is to be disposed and on the lower surface 20b side a plurality of pads (surface-bonding pads) 22 which serve as external connection terminals. The pads 22 are each 0.86 mm in diameter and arranged at a pitch of 1.27 mm and at corresponding positions to the first terminals T1 of the connecting board 10, i.e., in such a manner as to form a grid pattern consisting of 19 vertical rows and 19 horizontal rows. Each pad 22 has a tungsten base layer which is Ni—B-plated non-electrolytically and further gold-plated nonelectrolytically by a small amount for prevention of oxidation. Further, the pads 22 are connected to bonding pads (not shown) which are disposed in a cavity 21 for connection with an IC chip by way of an internal wiring (not shown).

Figure 7B:
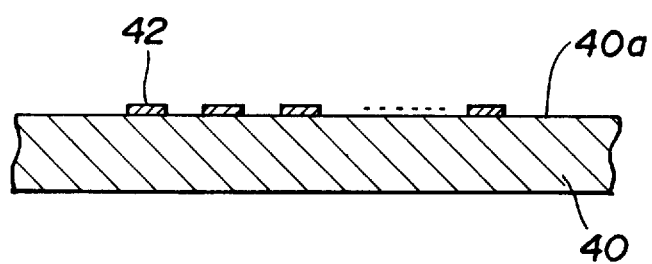
FIG. 7B is a sectional view of a printed circuit board to be bonded or connected to a connecting board.

A printed circuit board 40 as shown in FIG. 7B is prepared as a mounting board. The printed circuit board 40 is in the form of flat plate which is 30 mm square and 1.6 mm thick. The printed circuit board 40 is made of epoxy resin (Japanese Industrial Standard: FR-4). On the main surface 40a of the mounting board 40, pads 42 are formed at corresponding positions to the pads 22 of the LGA type base plate 20 and therefore the second terminals T2 of the connecting board 10. The pads 42 are made of copper, 25 μm thick and 0.72 mm in diameter and are arranged at a pitch of 1.27 mm so as to form a grid pattern consisting of 19 vertical rows and 19 horizontal rows.

Figure 8A:
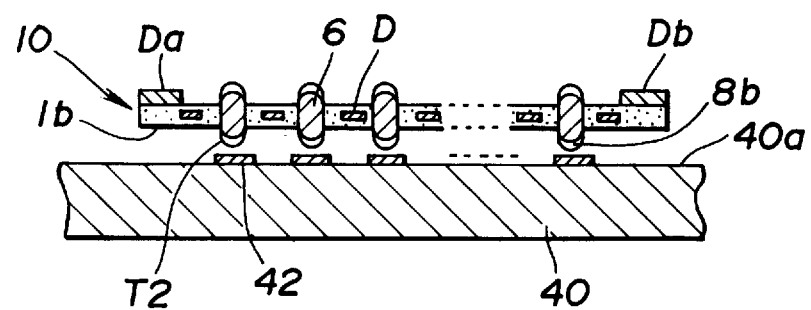

As shown in FIG. 8A, the printed circuit board 40 is placed so that the main surface 40a having the pads 42 is directed upward. Then, the connecting board 10 prepared in the above described manner is placed on the printed circuit board 40. In this instance, each pads 42 are aligned with the solder layers 8b formed on the soft metal bodies 6 on the lower surface (second surface) 1b side of the connecting board substrate 1, i.e., the second terminals T2.

Figure 8B:
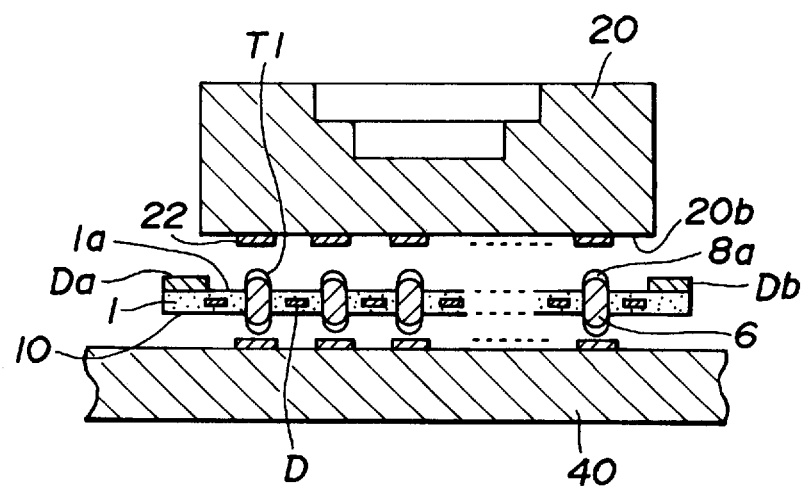

Further, as shown in FIG. 8B, the base plate 20 is placed on the connecting board 10 in such a manner that the surface 20b having the pads 22 faces down. In this instance, the pads 22 are aligned with the solder layers 8a formed on the soft metal bodies 6 and located on the upper surface (first surface) 1a side of the substrate 1, i.e., the first terminals T1.

Then, the terminals Da and Db are connected to a power source (now shown) to energize the heating wire D to make the heating wire D generate heat. By this, the solder layers 8a and 8b at the top of the first terminal T1 and the second terminal T2 are caused to melt, whereby the pads 22 and the pads 42 are bonded or connected by way of the soft metal bodies 6 of the connecting board 10.

In this instance, the heating by the heating wire D is carried out in such a manner as not to cause the soft metal bodies 6 to melt.

Figure 9:
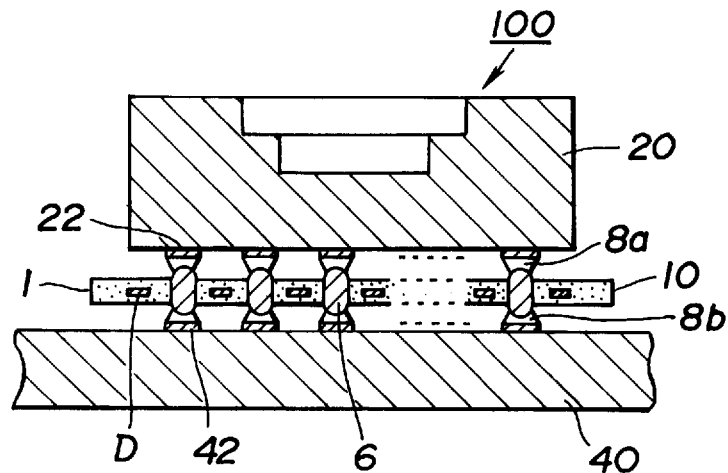
FIG. 9 is a sectional view of the base plate, connecting board and mounting board in an assembled or bonded state.

By this, as shown in FIG. 9, the connecting board 10 is connected to the LGA type base plate 20 and at the same time to the printed circuit board 40, so that three devices, i.e., the base plate, connecting board and mounting board which are joined together to complete an assembly 100. By so doing, the base plate 20 is connected to the mounting board 40 by way of the connecting board 10.

Furhter, although flux can be used at the time of joining of the above described three devices, they can be joined without using any flux since the pads 22 and 42 are gold-plated and prevented from oxidation.

Heretofore, it has been had to firstly apply low melting point solder paste to the pads 22 of the LGA type board, then dispose ball-shaped terminal members made of high temperature solder, etc. one by one on the pads 22, and thereafter form terminals by reflow for thereby making a BGA type base plate.

However, the above described method makes it possible to connect the base plate 20 to the printed circuit board 40 with ease by simply placing the connecting board 10 and the base plate 20 in this order on the printed circuit board 40 and energizing the heating wire D and thereby making it generate heat, so a process of once forming a LGA type base plate into a BGA type base plate becomes unnecessary, and further a process of applying solder paste to a printed circuit board becomes unnecessary.

Further, as mentioned above, in case bonding (i.e., soldering) is made without using any flux, a washing or cleaning process which is necessitated in case solder paste is used, becomes unnecessary. Furthermore, although the prior art method requires that the IC chip mounted on the base plate 20 be subjected to heating at a high temperature two times, i.e., one time for forming the BGA type base plate and another time for bonding to the printed circuit board, the above described method requires only one time, so deterioration of the chip can be prevented.

In the above-mentioned embodiment, the printed circuit board 40, the connecting board 10 and the LGA type base plate 20 are placed one upon another in this order, and by energizing the heating wire D the base plate 20 and the connecting board 10, and the connecting board 10 and the printed circuit board 40 are respectively bonded (soldered) together at one time or simultaneously, whereby to form the assembly 100. However, they need not be bonded together at one time. For example, the connecting board 10 may be connected to the LGA type base plate 20 to form a base plate with a connecting board and thereafter they may be connected to the printed circuit board 40. In this instance, the LGA type base plate 20 is placed on the connecting board 10, then they are bonded together by energizing the heating wire D, thereafter they are placed on the printed circuit board 40, and by energizing the heating wire D once again the connecting board 10 and the printed circuit board 40 are bonded together. Alternately, by energizing the heating wire D the connecting board 10 and the printed circuit board 40 can be bonded together first, and thereafter the base plate 20 and the connecting board 10 can be bonded. In any case, by the use of the connecting board 10 according to the present invention, it is made unnecessary to apply low melting point solder to the pads and dispose the terminal members one by one on the pads but it becomes possible to connect the base plate 10 to the mounting board 40 only by energizing the heating wire D once or twice. Therefore, IC chip manufacturers and users can omit some troublesome steps and/or equipment.

On the other hand, in the assembly 100, the top portions of the first terminal and the second terminal, i.e., the solder layers 8a and 8b can be melted by energizing the heating wire D, so the connecting board 10 (together with the base plate 20) can be separated from the printed circuit board 40 with ease. Further, the connecting board 10 can be separated from the base plate 20.

In the meantime, such separation can be done in the reverse order. In any event, it is not necessary for such separation to heat the entire of the base plate 20 and the printed circuit board 40 as in the prior art but such separation can be obtained by only energizing the heating wire.

Further, in the assembly consisting of such a LGA type base plate 20, connecting board 10 and printed circuit board 40, the connecting board 10 can absorb the difference in thermal expansion between the base plate 20 and the printed circuit board 40 and therefore can improve or make higher the durability and the reliability of the assembly.

Hereinafter, the operation will be described.

Little stress is caused between the base plate 20 and the connecting board substrate 1. This is because the base plate 20 and the connecting board substrate 1 are made of the same material and so there is not caused any difference in thermal expansion therebetween.

On the other hand, stresses are caused between the connecting board substrate 1 and the printed circuit board 40. This is because the connecting board substrate 1 and the printed circuit board 40 are made of the different materials. In this instance, a maximum stress is caused at the printed circuit board 40 side protruded portion 6b of each of the soft metal bodies 6 and the solder layers 8b adjacent the printed circuit board 40. However, since the soft metal bodies 6 (protruded portions 6b) are plastically deformable with ease, they deform at the protruded portions 6b to mitigate or lessen the stress. Accordingly, the stress having been caused between the connecting board substrate 1 and the printed circuit board 40 is resultantly made smaller, so their connection or bonding can be hard to break and reliable. Particularly, stress is not applied to the solder layers 8a adjacent the base plate 20 side pads 22 by the provision of the connecting board 10, such solder layers in the prior art assembly being liable to be stressed. On the other hand, the stress between the connecting board 10 and the printed circuit board 40 is absorbed by the effect of deformation of the soft metal bodies 6, so the protruded portions 6b of the soft metal bodies 6 are hard to break, and also the solder layers 8b adjacent the pads 42 of the printed circuit board 40 are hard to break.

That is, the prior art assembly is structured so that the stress caused between the base plate and the printed circuit board becomes maximum at the low temperature solder portions which are relatively hard and brittle. However, according to the present invention, by the use of the connecting board the assembly can be structured so that the maximum stress is applied to the portions of the soft metal bodies which are plastically deformable and hard to break and the stress is absorbed by plastic deformation of the soft metal bodies, whereby it becomes possible not to apply large stress to the low temperature solder portions.

Figure 10:
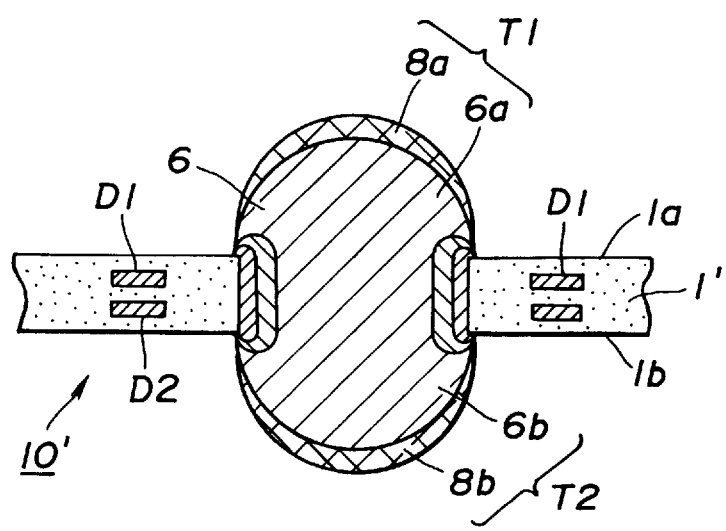
FIG. 10 is a fragmentary, sectional view of a connecting board having formed therewithin two heating wires according to a variant of the present invention.

In the above described embodiment, the connecting board 10 has been described and shown to have a single heating wire D inside the connecting board substrate 1 to melt the top portions of both of the first and second terminals. However, as shown in FIG. 10, it can be replaced by such a circuit board 10' which has, inside a substrate 1', a first surface side heating wire D1 on the upper surface side 1a and a second surface side heating wire D2 on the lower surface side 1b.

By this, by energizing the first surface side heating wire D1 the top portions of the first terminals T1 located adjacent the heating wire D1, i.e., the solder layers 8a can be melted more with ease. On the other hand, by energizing the second surface side heating wire D2 the top portions of the second terminals T2 located adjacent the heating wire D2, i.e., the solder layers 8b can be melted more with ease.

It will be apparent that such a connecting board substrate 1' can be formed from three ceramic green sheets and by the substantially the same technology as described with respect to the above embodiment.

It is needless to say that in case of joining the LGA type base plate 20 and the printed circuit board 40 by using such a connecting board 10', the three devices are placed one upon another similarly to the above described embodiment and then the heating wires D1 and D2 are energized to bond or connect them all at once.

Further, for bonding or connection of the LGA type base plate 20 and the connecting board 10' it will suffice to energize the first surface side heating wire D1, and for bonding or connection of the connecting board 10' and the printed circuit board 40 it will suffice to energize the second surface side heating wire D2.

Further, in case the assembly of the LGA type base plate 20, connecting board 10' and printed circuit board 40 is to be disassembled, the LGA type base plate 20 and the connecting board 10' can be disassembled or separated by energizing the first surface side hating wire D1. On the other hand, by energizing the second surface side heating wire D2, the connecting board 10' and the printed circuit board 40 can be disassembled or separated. Accordingly, by selection of the heating wires, the solder between the devices to be disassembled can be melted selectively or preferentially, so disassembly or separation can be done more easily and efficiently.

Further, though it is a matter of course, the subassembly of the LGA type base plate 20 and the connecting board 10', i.e., the base plate with the connecting board can be disassembled or separated more efficiently by energizing the first surface side heating wire D1. Further, on the contrary, by energizing the second surface side heating wire D2 the assembly of the connecting board 10' and the printed circuit board 40 can be disassembled with efficiency.

In the above described embodiments, the heating wires D, D1 and D2 have been described and shown as being formed inside the connecting board substrate 1, they can be formed on the first surface or second surface of the connecting board substrate. In this instance, the heating wire D can be formed by baking on the substrate by a post firing technology. By doing so, a material that is difficult to use in case of simultaneous or concurrent firing, can be used, so selection of the material for the heating wire D can be done with ease.

In the above described embodiments, the base plate and the connecting board substrate are made of alumina ceramic and the printed circuit board is made of glass epoxy resin. However, if such a material having a coefficient of thermal expansion intermediate between those of the base plate and the mounting board is used for forming the connecting board substrate, the stress resulting from the difference in thermal expansion can be distributed to the joining portion between the base plate and the connecting board substrate and to the joining portion between the connecting board substrate and the mounting board substrate, so the solder layers can be harder to break.

In the above described embodiments, alumina ceramic is used as a material for the connecting board substrate 1, this is not for the purpose of limitation. For example, aluminum nitride, silicon nitride, silicon carbide, mullite and the like ceramic can be used for forming the connecting board substrate 1. Particularly, it is desirable or preferable to select a material having a large rupture strength and good toughness as a material for forming the connecting board substrate 1 since relatively high stresses are applied to the substrate 1. On the other hand, by selecting a material having a good heat conduction property (e.g., aluminum nitride, silicon carbide or the like) as a material for the substrate 1, the heat generated by the heating wire can be conducted efficiently to the terminals, and temperature variations of the terminals depending upon the locations thereof (e.g., how inside or outside of the substrate 1 they are located) can be made smaller.

In the meantime, judging from the materials which the base plate and the mounting board are made of, a resinous material such as glass epoxy, BT resin and the like can be used as a material for the connecting board substrate, though it is necessary to pay attention to the temperature of the connecting board substrate at the time of heating by the heating wire since deterioration of the material is liable to be caused by heat generated by the heating wire.

The base plate 20 is not limited to the above described alumina ceramic base plate but other ceramic materials such as aluminum nitride, mullite, glass ceramic and the like can be used and selected suitably for forming the base plate 20. Further, the bae plate 20 can be made of a resinous material such as glass epoxy, BT resin or the like. Further, the base plate 20 is not limited to such one that installs or mounts thereon an integrated circuit chip. That is, it can installs or mounts thereon, other than an integrated circuit chip, active elements such as transistors or the like, electronic parts such as resistors, capacitors and the like.

Further, bonding of the IC chip to the base plate 20 can be made either by wire bonding or by flip chip bonding.

Further, while the mounting board has been described in the above described embodiments as being a printed circuit board 40 made of glass epoxy resin, this is not for the purpose of limitation. That is, the mounting board made of other materials such as BT resin, phenol resin or the like will suffice or the mounting board made of ceramic such as alumina will suffice. Further, while the mounting board has been described and shown by way of example as being a motherboard, it may be either of the kind for mounting thereon a single base plate or of the kind for mounting thereon a plurality of base plates.

Further, while the jig having a property of being unwettable to molten soft metal has been described by way of example in the above described embodiment as being made of carbon (graphite), it may be made of other materials which are heat-resistant and unwettable to molten metal used, i.e., may be made of, other than carbon, boron nitride, silicon nitride, ceramic such as alumina, or metal such as stainless steel. Particularly, since the above described transfer plate is in the form of a plate, stainless steel can be used conveniently for the jig since the jig made of stainless steel is hard to cause cracks or the damage. On the other hand, ceramic can be used conveniently for the jig in order to make its coefficient of thermal expansion smaller and prevent its bending or warp.

In the meantime, while a transfer plate formed with through holes is used in the above described embodiment, a transfer plate formed with depressions may be used in place therefor. Particularly, through adjustment of the depth of the depressions, the tops of the solder layers can be flattened. In this instance, the solder layers can be made uniform in height, so when the base plate or the mounting board and the connecting board are placed one upon the other the solder layers can be brought into contact with or can be sufficiently close to the matching pads, thus making it possible to connect or bond the solder layers and the pads assuredly. Further, when the top portions of the solder layers are flattened, movement of the connecting board or base plate (or mounting board) at the time of joining of the connecting board and base plate (or mounting board) is hard to occur, thus making it possible to attain the bonding more with ease. In the meantime, after the first surface side and second surface side solder layers are formed, they may be pressed by parallel flat plates or pressed while being heated to melt, so as to have flattened tops.

What is claimed is:

1. A connecting board to be interposed between a base plate having a plurality of surface-bonding pads and a mounting board having a plurality of surface-bonding and mounting pads at the corresponding positions to the surface-bonding pads of the base plate, for connection of the base pate and the mounting board, the connecting board comprising:

a substrate in the form of flat plate, having opposite first and second surfaces;

a plurality of first terminals disposed on said first surface of said substrate for connection to the surface-bonding pads of the base plate;

a plurality of second terminals disposed on said second surface of said substrate for connection to the surface-bonding and mounting pads of the mounting board; and a heating wire provided to said substrate for causing top portions of at least one of a group of said first terminals and a group of second terminals to melt when energized.

2. The connecting board according to claim 1, wherein said heating wire is disposed on a first surface side of said substrate to constitute a first surface side heating wire for causing said top portions of said first terminals to melt when energized.

3. The connecting board according to claim 1, wherein said heating wire is disposed on a second surface side of said substrate to constitute a second surface side heating wire for causing said top portions of said second terminal to melt when energized.

4. The connecting board according to claim 1, further comprising a second heating wire disposed on a second surface side of said substrate to constitute a second surface side heating wire for causing said top portions of said second terminal to melt when energized, said first mentioned terminal being disposed on a first surface side of said substrate to constitute a first surface side heating wire for causing said top portions of said first terminals to melt when energized.

5. The connecting board according to claim 1, wherein said heating wire is constructed and arranged so as to cause at least one of the groups of said first terminals and the group of said second terminals to be heated to a uniform temperature irrespective of positions thereof.

6. The connecting board according to claim 5, wherein said heating wire has an interior wire section which is located at an interior part of said substrate and an exterior wire section which is located at an exterior part of said substrate, said exterior wire section having a larger resistance per unit length than said interior wire section.

7. The connecting board according to claim 1, wherein said heating wire is disposed inside of said substrate.

8. The connecting board according to claim 1, further comprising a first leader line terminal connected to one of opposite ends of said heating wire and a second leader line terminal connected to the other of said opposite ends of said heating wire, said first and second leader line terminals being disposed at peripheral corner portions of said substrate.

9. The connecting board according to claim 1, wherein said substrate is made of ceramic.

10. The connecting board according to claim 1, wherein said substrate has a plurality of through holes extending between said first and second surfaces, a plurality of soft metal bodies being mounted in said through holes, respectively, each of said soft metal bodies having a first surface side protruded portion protruding from said first surface of said substrate and a second surface side protruded portion protruding from said second surface of said substrate, a first solder layer being formed on said first surface side protruded portion and a second solder layer being formed on said second surface side protruded portion, said first and second solder layers having a lower melting point than said soft metal bodies, each of said first terminal being constituted by said first solder layer and said first surface side protruded portion of each of said soft metal bodies and each of said second terminal being constituted by said second solder layer and said second surface side protruded portion of each of said soft metal bodies.

11. A method of making a connecting board, comprising steps of:

preparing a first ceramic green sheet and a second ceramic green sheet which are respectively formed with a plurality of through holes at corresponding positions to each other, forming on an upper surface of said second ceramic green sheet a heating wire pattern of a heating conductor paste, and thereafter placing said first ceramic green sheet on said second ceramic green sheet in such a way that said heating wire pattern is disposed inside of said first and second green sheets, for thereby constituting a laminated green sheet assembly;

applying metal paste to inner peripheral surfaces of said through holes and to surface portions of said laminated green sheet assembly next to the opposite ends of each of said through holes;

firing said laminated assembly to form a connecting board substrate having a first surface and a second surface, and metal layers in the through holes;

pouring, from either of a first surface side and a second surface side of said substrate, a mass of molten metal into each of said through holes and forming a soft metal body having a first surface side protruded portion and a second surface side protruded portion protruding from said first and second surfaces of said connecting board substrate, respectively; and forming a first solder layer and a second solder layer having a lower melting point than said soft metal bodies, on said first surface side protruded portion and said second surface side protruded portion of each of said soft metal bodies.

12. A subassembly of a connecting board and a base plate, wherein the base plate has a plurality of surface-bonding pads, and the connecting board includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding and mounting pads of the mounting board, and a heating wire provided to the substrate for causing top portions of the second terminals to melt when energized, and wherein said first terminals of said connecting board are bonded to said surface-bonding pads of said base plate, respectively.

13. A subassembly of a connecting board and a base plate, wherein the base plate has a plurality of surface-bonding pads, and the connecting board includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding and mounting pads of the mounting board, and a heating wire provided to the substrate for causing top portions of the first terminals to melt when energized, and wherein said first terminals of said connecting board are bonded to said surface-bonding pads of said base plate, respectively.

14. An assembly of a base plate, a connecting board and a mounting board, wherein the base plate has a plurality of surface-bonding pads;

the mounting board has a plurality of surface-bonding and mounting pads at the corresponding positions to said surface-bonding pads of said base plate; and the connecting board includes a substrate in the form of flat plate, having opposite first and second surfaces, a plurality of first terminals disposed on said first surface of said substrate for connection to said surface-bonding pads of said base plate, a plurality of second terminals disposed on said second surface of said substrate for connection to said surface-bonding and mounting pads of said mounting board, and a heating wire provided to said substrate for causing top portions of at least one of a group of said first terminals and a group of second terminals, when energized; and wherein said connecting board is interposed between said base plate and said mounting board, said surface bonding pads of said base plate are bonded to said first terminals of said connecting board on a first surface side of said substrate, respectively, and said surface bonding and mounting pads of said mounting board are bonded to said second terminals of said connecting board on a second surface side of said substrate, respectively.

15. A method of making an assembly of a base plate, a connecting board and a mounting board, comprising steps of;

preparing the base plate having a plurality of surfacebonding pads;

preparing the mounting board having a plurality of surface-bonding and mounting pads at the corresponding positions to the surface-bonding pads of the base plate;

preparing the connecting board which includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding pads of the mounting board, and a heating wire provided to the substrate for causing top portions of the first and second terminals to melt, when energized;

interposing the connecting board between the base plate and the mounting board;

energizing the heating wire to melt the top portions of the first and second terminals; and thereby bonding the first terminals on the first surface side of the substrate to the surface-bonding pads of the base plate for thereby bonding the connecting board to the base plate, and bonding the second terminals on the second surface side of the substrate to the surface-bonding and mounting pads of the mounting board for thereby bonding the connecting board to the mounting board.

16. A method of making an assembly of a base plate, connecting board and a mounting board, comprising steps of:

preparing the base plate having a plurality of surface-bonding pads;

preparing the mounting board having a plurality of surface-bonding and mounting pads at corresponding positions to the surface-bonding pads of the base plate;

preparing the connecting board which includes a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding and mounting pads of the mounting board, and a heating wire provided to the substrate for causing top portions of the first and second terminals to melt when energized;

preparing a subassembly of the base plate and the connecting board by placing the connecting board and the base plate one upon the other, energizing the heating wire of the connecting board to melt the top portions of the first terminals and bonding the first terminals of the connecting board to the surface-bonding pads of the base plate, respectively;

placing the subassembly of the base plate and the connecting board on the mounting board; and energizing the heating wire to melt the top portions of the second terminals on the second surface side of the substrate and bonding the surface-bonding and mounting pads of the mounting board to the second terminals.

17. A method of disassembling an assembly of a base plate, connecting board and mounting board, the base plate having a plurality of surface-bonding pads, the mounting board having a plurality of surface-bonding and mounting pads at the corresponding positions to the surface-bonding pads of the base plate, and the connecting board including a substrate in the form of flat plate, having opposite first and second surfaces, a plurality of first terminals disposed on the first surface of the substrate for connection to the surface-bonding pads of the base plate, a plurality of second terminals disposed on the second surface of the substrate for connection to the surface-bonding pads of the mounting board, and a heating wire provided to the substrate for causing top portions of at least one of a group of the first terminals and a group of the second terminals to melt when energized, the connecting board being interposed between the base plate and the mounting board and bonded on the first surface side of the substrate to the base plate through bonding of the first terminals thereof to the surface-bonding pads of the base plate and on the second surface side of the substrate to the mounting board through bonding of the second terminals thereof to the surface-bonding and mounting pads of the mounting board, the method comprising steps of:

energizing said heating wire and melting top portions of at least one of the group of said first terminals and the group of said second terminals; and separating at least one of said base plate and said mounting board from said connecting board.

* * * * *